United States Patent [19]

Alsup

[11] 4,329,651

[45] May 11, 1982

[54] CHIRP FILTERS/SIGNALS

[75] Inventor: James M. Alsup, San Diego, Calif.

[73] Assignee: The United States of America as represented by the Secretary of the Navy, Washington, D.C.

[21] Appl. No.: 138,640

[22] Filed: Apr. 9, 1980

[51] Int. Cl.$^3$ ............................................. H03B 19/00
[52] U.S. Cl. ..................................... 328/14; 328/167; 333/193; 364/827
[58] Field of Search ............... 364/819, 821, 824, 825, 364/827; 328/14

[56] References Cited

U.S. PATENT DOCUMENTS

| | | | |
|---|---|---|---|
| 3,925,648 | 12/1975 | Spriser et al. | 333/193 |
| 4,099,148 | 7/1978 | Alsup et al. | 328/14 |
| 4,100,498 | 7/1978 | Alsup et al. | 328/14 |
| 4,282,579 | 8/1981 | Spriser et al. | 364/827 |

*Primary Examiner*—Harold A. Dixon
*Attorney, Agent, or Firm*—Robert F. Beers; Ervin F. Johnston; John Stan

[57] ABSTRACT

A discrete chirp generator produces discrete chirp signals which correspond to either of two exponential functions, namely the functions $\exp[j\pi(m^2+\alpha)/N]$ or $\exp(j\pi[m(m+\beta)+\alpha]/N)$, where $m=0, 1, 2, \ldots, M$. Typically, M and N might both have the value 256.

Similarly, a discrete chirp filter is described by its impulse response which has one of these same two functional forms.

These two new components (discrete chirp generator and discrete chirp filter) can be used to implement
(a) an improved type of frequency synthesizer, and
(b) an improved type of discrete Fourier transformer.

In the former, a single generator is used in conjunction with delay, conjugation, multiplication, and low-pass filter components to achieve an improved synthesizer. In the latter, either of the two discrete chirp function generators is combined with an input signal $g_n$ in a multiplier. The output of the multiplier is fed into the input of a filter which is configured in a manner similar to the same chirp function as the chirp generator, except that the exponential has the opposite sign in the filter from the sign of the chirp function generator. The output of the filter is combined in a multiplier with a similar chirp function, to result in a complex output signal $G_m$ which represents the discrete Fourier transform of the input signal $g_n$.

7 Claims, 5 Drawing Figures

SECOND IMPROVED DISCRETE CHIRP SYNTHESIZER

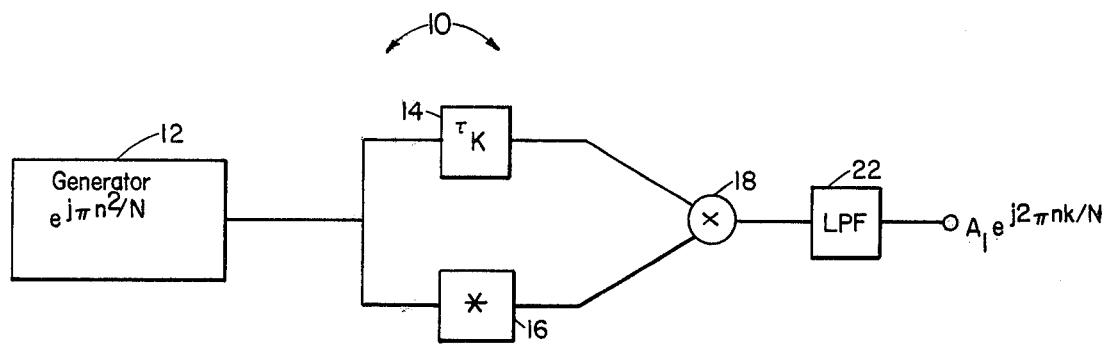
FIG. 1   PRIOR ART DISCRETE CHIRP SYNTHESIZER
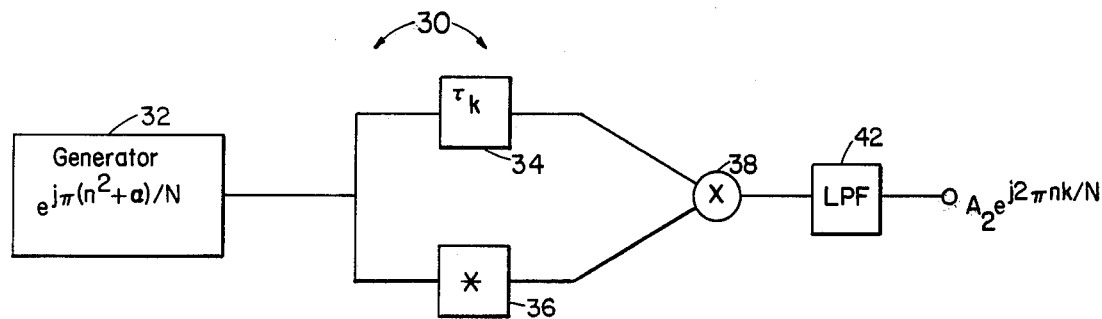
FIG. 2   FIRST IMPROVED DISCRETE CHIRP SYNTHESIZER
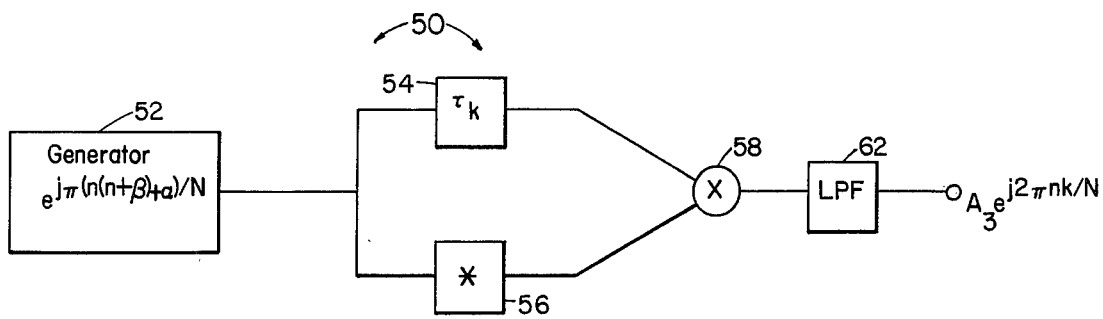
FIG. 3   SECOND IMPROVED DISCRETE CHIRP SYNTHESIZER

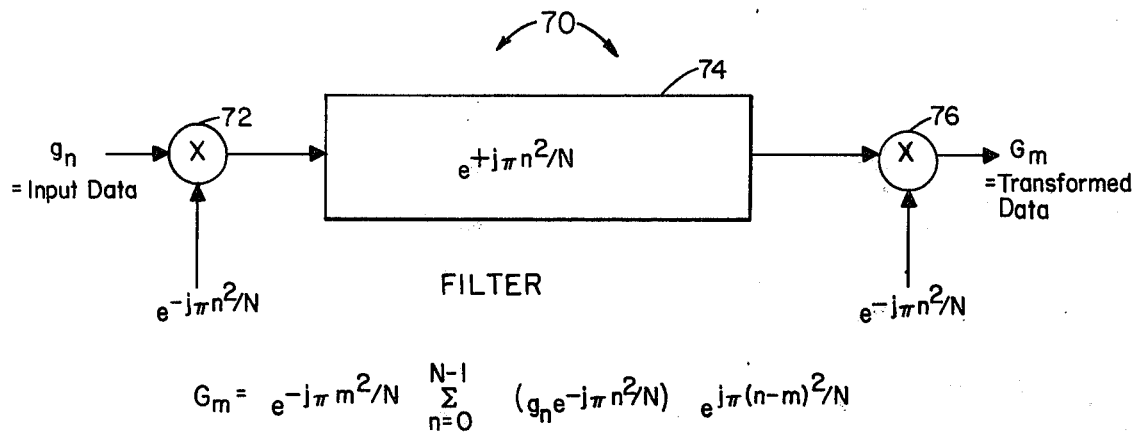
FIG. 4 (PRIOR ART) CHIRP-Z TRANSFORM (CZT) IMPLEMENTATION OF THE DFT
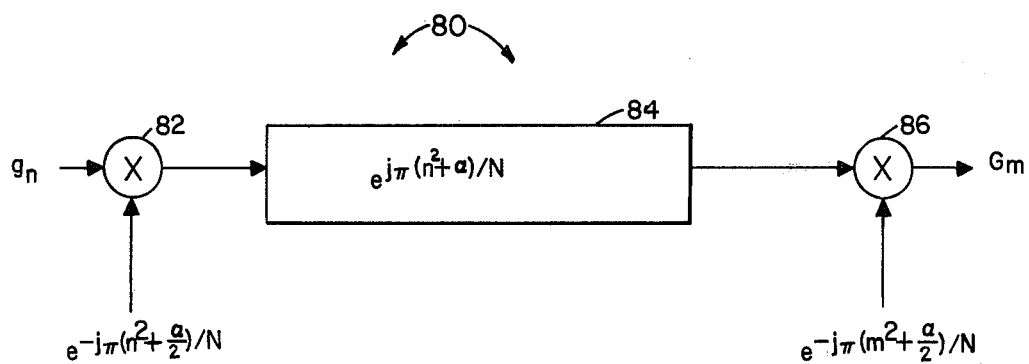
FIG. 5 IMPROVED CZT IMPLEMENTATION OF THE DFT

CHIRP FILTERS/SIGNALS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

A transformation of considerable importance for signal processing is the discrete Fourier transform (DFT). It may be calculated using the chirp-Z transform (CZT) algorithm, a method which is suitable for implementation via acoustic surface wave devices as well as other forms of the transversal filter. The CZT algorithm decomposes the DFT into a premultiplication by a discrete chirp, a convolution with a discrete chirp, and a postmultiplication by a discrete chirp.

This is illustrated in FIG. 4 and by the following equations for an N-point DFT:

$$G_m = \sum_{n=0}^{N-1} e^{j2\pi mn/N} g_n; \quad (1)$$

but, $$-2mn = -m^2 + (m-n)^2 - n^2; \quad (2)$$

as may be seen by expanding the right side of the equation.

Therefore, $$G_m = e^{-j\pi m^2/N} \sum_{n=0}^{N-1} e^{j\pi(m-n)^2/N} (e^{-j\pi n^2/N} g_n). \quad (3)$$

Since this algorithm requires the use of complex numbers, its implementation with real hardware requires the use of four convolvers. The real and imaginary components of the input signal $g_n$ are multiplied by the real and imaginary components of the premultiplier chirp, $e^{-jn^2/N}$, as indicated by the two factors in the parenthesis of Eq. (3), and combined in pairs to drive the inputs of four chirp convolvers. The convolution is expressed by the terms including and to the right of the summation sign $\Sigma$. The convolver outputs are combined in pairs and multiplied by the real and imaginary components of the postmultiplier chirp, $e^{-j\pi m^2/N}$, and combined again to provide the real and imaginary components of the output $G_m$.

The computation time of the device is proportional to the number of samples, N, in the time signal. If N is a power of 2 the computation time of the Fast Fourier Transform (FFT) is N log₂ N. This device is thus a factor of log₂ N faster than a FFT device using one complex multiplier of the same speed.

The background information hereinabove is derived from an article entitled "Real Time Discrete Fourier Transforms Using Surface Acoustic Wave Devices", by J. M. Alsup, et al, which appeared in the *Proc. IEE International Specialists Seminar on Component Performance and System Applications of Surface Acoustic Wave Devices*, Aviemore, Scotland, U.D., September 25-27, 1973.

Two other articles provide useful background information. One is entitled "Surface Acoustic Wave CZT Processors", by J. M. Alsup, which appears in the 1974 Ultrasonics Symposium Proceedings, IEEE Cat. No. 74 CHO 896-1SU. The other article is entitled "Frequency Synthesis via the Discrete Chirp and Prime Sequence ROM's", by James M. Alsup, et al which appeared in the Proceedings of the IEEE, Vol. 64, May 1976.

SUMMARY OF THE INVENTION

A new kind of discrete chirp generator and a new kind of discrete chirp filter can be used to build improved synthesizers and analyzers.

For the synthesizer a single discrete chirp generator is used along with other prior-art components to implement a discrete frequency synthesizer (programmable). This generator of discrete chirp signals comprises a signal generator which generates a signal $e^{j\pi(n(n+\beta)+\alpha)/N}$, where $n = 0, 1, 2, \ldots, M$ and $\beta$, $\alpha$ and N are constants. A delay line, having an input connected to the output of the signal generator, delays its input signal by a time delay $\tau_k, k = 0, 1, 2, \ldots, M$. A converter, also having an input connected to the output of the signal generator, converts the signal that is its input into the complex conjugate of the signal, at the output of the converter. A multiplier, having as its inputs the output of the delay line and the converter, multiplies its input signals. A low-pass filter, whose input is connected to the output of the multiplier, filters its input signal, and provides at its output a sinusoidal waveform with a discretely-programmable frequency.

For the analyzer, two of the chirp generators may be used in combination with two multipliers and one of the chirp filters between the multipliers to provide an improved chirp-Z transform (CZT) implementation of the discrete Fourier transform.

OBJECTS OF THE INVENTION

An object of the invention is to provide a means for generating a chirp signal and/or a chirp filter more accurately than in the prior art.

Another object of the invention is to provide a means for generating a chirp signal or filter which has better electrical balance with respect to in-phase and quadrature components.

Yet another object of the invention is to provide a discrete Fourier transform system utilizing two of the chirp signal generating means along with one chirp filter means, and therefore incorporating their advantages.

These and other objects of the invention will become more readily apparent from the ensuing specification when taken together with the drawings.

BRIEF DESCRIPTION OF THE DRAWINGS

FIG. 1 is a block diagram of a prior art discrete chirp synthesizer.

FIG. 2 is a block diagram of one embodiment of the discrete chirp synthesizer of this invention.

FIG. 3 is a second embodiment of the discrete chirp synthesizer.

FIG. 4 is a block diagram of a prior art chirp-Z transform (CZT) implementation of the discrete Fourier transform.

FIG. 5 is a block diagram of an improved CZT implementation of the discrete Fourier transform, utilizing the new signals.

DESCRIPTION OF THE PREFERRED EMBODIMENTS

FIG. 1 illustrates a prior art synthesizer 10 using a discrete chirp generator 12. The chirp generator 12 produces a sinusoidal signal $e^{+j\pi n^2/N}$. The output signal follows two paths, one path going to delay line 14 and the other going to conjugate converter 16. Delay line 14 delays its input signal by an amount $\tau_k$, where $\tau_k = k\tau_I$, $\tau_I$ is the minimum delay, and k may have any of several integer values. Conjugate converter 16 converts its input signal into the complex conjugate of the input signal.

A multiplier 18 multiplies its two input signals, the delayed signal from delay line 14 and the conjugated signal from converter 16. The multiplied signal may have undesirable high frequencies which are removed by a low-pass filter 22. The output signal, $A_1 e^{j2\pi nk/N}$, is a pure sinusoidal frequency, whose frequency is a function of k. The term $A_1$ is generally complex, and therefore provides an additional phase term.

Referring now to FIG. 2, therein is shown a first embodiment of the improved discrete chirp synthesizer 30 of this invention. It will be seen that chirp generator 32 comprises the major difference between the synthesizer 10 shown in FIG. 1 and the synthesizer 30 shown in FIG. 2.

In all the embodiments of this invention, the discrete chirp function is an essential signal waveform. It is a complex-valued series of numbers which may be used as a time-series waveform or a space-series waveform, or as a modulation function on either of these. The term n is an integer having any value from zero to M, whereas N is also an integer which may or may not be equal to M.

In the improved form of the discrete chirp function, $\exp(j\pi(n^2+\alpha)/N)$, the parameter $\alpha$ is a new constant added to the argument as indicated, and represents an arbitrary phase shift at which the discrete chirp may be initiated.

A second embodiment of an improved discrete chirp synthesizer 50 is shown in FIG. 3. The improvement resides in the functional form of the signal produced by generator 52. It will be observed that in the generated signal $e^{j\pi(n(n+\beta)+\alpha)/N}$, there is an additional parameter $\beta$ which may be used to implement an arbitrary frequency offset into the discrete chirp function.

It will be noted that, in FIGS. 1, 2 and 3, the output signals at outputs 24, 44 and 64, respectively, have the same form, differing only in the constants $A_1$, $A_2$ and $A_3$.

The relationships of the three constants $A_1$, $A_2$ and $A_3$ are as follows.

For the embodiment shown in FIG. 1:

$$e^{j\pi n^2/N} e^{-j\pi(n-k)^2/N} = A_1 e^{j2\pi nk/N} \quad (A_1 = e^{-j\pi k^2/N}) \quad (4)$$

For the embodiment shown in FIG. 2:

$$e^{j\pi(n^2+\alpha)/N} e^{-j\pi((n-k)^2+\alpha)/N} \quad (5)$$

$$= A_2 e^{j2\pi nk/N}, (A_2 = A_1 = e^{-j\pi k^2/N})$$

For the embodiment shown in FIG. 3:

$$e^{j\pi(n\{n+\beta\}+\alpha)/N} e^{-j\pi(\{n-k\}\{n-k+\beta\}+\alpha)/N} \quad (6)$$

$$= A_3 e^{j2\pi nk/N}, (A_3 = e^{-j(\pi k/N)(k-\beta)})$$

The prior art embodiment shown in FIG. 1 is described in great detail in U.S. Pat. No. 4,100,498, entitled, DISCRETE CHIRP FREQUENCY SYNTHESIZER, to James M. Alsup et al, which issued on July 11, 1978.

The improvements realized in the embodiments 30 and 50 of FIGS. 2 and 3, respectively, are the following:

(1) the smallest value taken on by the discrete function can be larger in the new embodiments; and (2) the sum of the absolute values of the "real" values can be equalized to have the same value as the sum of the absolute values of the "imaginary" values of the (complex) discrete chirp function.

The first improvement allows the taps on a transversal filter to be larger throughout, and for a surface-acoustic wave (SAW) device implementation reduces problems associated with diffraction from and to small apertures, or in the case of a charge-coupled device implementation, it reduces problems associated with small charge wells and thermal noise build-up.

The second improvement allows equilization of driving and receiving impedances for real and imaginary parts of a complex-valued surface acoustic wave (SAW) transducer structure (discrete chirp transducer), or for charge-coupled device (CCD) implementations.

As alternative constructions, the discrete delay $\tau_k$, which takes place in delay lines 34 and 54, and the conjugation operation (*), which takes place in converters 36 and 56, may be placed in either input to the multiplier, 38 or 58, or both could be placed in the same input line. Other alternative embodiments would include explicit carrier operation at either the sum or difference frequencies.

The same principle can be invoked for applications utilizing the discrete chirp as the impulse response of a matched filter or of a filter used in a CZT system. The same two important properties are gained by the use of the additional parameter $\alpha$ and/or $\beta$.

Reference is now directed to FIG. 4, wherein is shown in prior art chirp-Z transform (CZT) implementation 70 of the discrete Fourier transform (DFT). The input data $g_n$ may comprise either a sampled analog signal or a digital signal. A plurality of N samples would be used at a time. This prior art embodiment 70 is described hereinabove in the "Background of the Invention".

Referring now to FIG. 5, therein is shown an improved discrete Fourier transform generator having an input to which a signal $g_n$ may be applied, $n = 0, 1, 2, \ldots, N$.

An input means for multiplying 82 is adapted to receive the signal $g_n$ and the signal $$e^{-j\pi(n^2 + \frac{\alpha}{2})/N}$$

A filter 84 whose input is connected to the output of the input multiplying means 82 has a plurality of taps weighted according to the function $e^{j\pi(n^2+\alpha)/N}$ for convolving the input signal.

An output means for multiplying 86 has as inputs the output of the convolving means 84 and a signal $$e^{j\pi(n2+\frac{\alpha}{2})/N}.$$

The output signal $G_m$ of the output means for multiplying 86 is the discrete Fourier transform of the input signal $G_m$.

The three exponential functions shown in FIG. 5 may all be implemented on surface acoustic wave (SAW) devices.

Obviously, many modifications and variations of the present invention are possible in the light of the above teachings, and, it is therefore understood that within the scope of the disclosed inventive concept, the invention may be practiced otherwise than specifically described.

What is claimed is:

1. A synthesizer of discrete signals, comprising:
   means for generating a chirp signal $e^{j\pi(n(n+\beta)+\alpha)/N}$, where $n=0, 1, 2, \ldots, M$, and $\beta$, $\alpha$ and $N$ are constants;
   means, having an input connected to the output of the chirp generating means, for delaying its input signal by a time delay $\tau_k$, $k=0, 1, 2, \ldots, M$;
   means, also having an input connected to the output of the chirp generating means, for converting the signal at its input into a signal which is the complex conjugate of its input signal;
   means having as its two inputs the outputs of the delaying and the converting means, for multiplying its input signals; and
   means, whose input is connected to the output of the multiplying means, for filtering its input signal in order to remove high-frequency components of the input signal, the output signal being a complex sinusoidal frequency.

2. The generator according to claim 1, wherein: the generator means generates a signal $e^{j\pi(n2+\alpha)/N}$, $\beta$ being equal to 0.

3. The generator according to claim 1 wherein: the signal generating means is a surface acoustic wave (SAW) device.

4. The generator according to claim 1 wherein: the signal generating means is a digital read-only memory (ROM).

5. The generator according to claim 1 wherein: the signal generating means is a random-access memory (RAM).

6. A discrete Fourier transform (DFT) analyzer having an input to which a signal $g_n$ may be applied, $n=0, 1, 2, \ldots, M$, comprising:
   an input means for complex multiplying, adapted to receive the signal $g_n$ and the signal $$e^{-j\pi(n2+\frac{\alpha}{2})/N};$$

a filter means, whose complex input is connected to the complex output of the input multiplying means, having a plurality of taps weighted according to the function $e^{j\pi(n2+\alpha)/N}$, for convolving with its input signal; and
   an output means for complex multiplying, having as inputs the output of the complex filter means and a signal $$e^{-j\pi(m2+\frac{\alpha}{2})/N},$$

the output signal $G_m$ of this means for multiplying being the discrete Fourier transform of the input signal $g_n$.

7. The DFT analyzer according to claim 6 wherein: the filter means ia a SAW device.

* * * * *